US010719642B2

(12) United States Patent
Karnia

(10) Patent No.: US 10,719,642 B2
(45) Date of Patent: Jul. 21, 2020

(54) AUTOMATED GENERATION OF ELECTRONICS SCHEMATICS WITH SINGLE WIRE TRACING

(71) Applicant: Caterpillar Inc., Deerfield, IL (US)

(72) Inventor: Jarett S. Karnia, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 16/163,158

(22) Filed: Oct. 17, 2018

(65) Prior Publication Data
US 2020/0125689 A1   Apr. 23, 2020

(51) Int. Cl.
| G06F 15/04 | (2006.01) |
| G06F 17/50 | (2006.01) |
| G06F 30/30 | (2020.01) |
| G06F 3/0484 | (2013.01) |
| G06F 3/0489 | (2013.01) |
| G06F 30/39 | (2020.01) |

(52) U.S. Cl.
CPC ............ *G06F 30/30* (2020.01); *G06F 3/0489* (2013.01); *G06F 3/04845* (2013.01); *G06F 30/39* (2020.01)

(58) Field of Classification Search
USPC ........ 716/105, 107, 112, 113, 114, 119, 122, 716/139
See application file for complete search history.

(56) References Cited

U.S. PATENT DOCUMENTS

| 5,889,677 A * | 3/1999 | Yasuda ............... G06F 17/5022 716/113 |
| 6,301,693 B1* | 10/2001 | Naylor ............... G06F 17/5072 716/114 |
| 7,257,793 B2 | 8/2007 | Okano |
| 7,865,857 B1* | 1/2011 | Chopra ............... G06F 17/5068 716/119 |
| 8,214,789 B2 | 7/2012 | Boose |
| 9,105,120 B2 | 8/2015 | Shimoyama |
| 2008/0216040 A1* | 9/2008 | Furnish ............... G06F 17/5068 716/122 |
| 2011/0246955 A1* | 10/2011 | Ohtsuka ............... G06F 17/5077 716/112 |
| 2012/0304105 A1 | 11/2012 | Rosman LeFever |
| 2015/0143309 A1* | 5/2015 | De Dood ............ G06F 17/5068 716/107 |
| 2015/0356724 A1* | 12/2015 | Yamada ................ G06F 17/505 716/105 |

* cited by examiner

*Primary Examiner* — Brian Ngo
(74) *Attorney, Agent, or Firm* — Lee & Hayes, PLLC

(57) ABSTRACT

A method includes sorting a plurality of line objects in an electronics schematics file into predetermined categories that include horizontal lines, vertical lines, diagonal lines, and connector pins, among others. The processor determines a first association of a first line object of the plurality of line objects that is associated with a first pin object. The first the association indicates that the first line object and the plurality of line objects are part of a single line, and the first pin object is part of the single line. The processor determines a second association of a circuit start point that is associated with the first pin object, and forms a first circuit line group including the first association, the second association, and the circuit end point of the single line. The processor generates an electronics schematic output file that presents the first circuit line group with user-selectable single line tracing.

17 Claims, 9 Drawing Sheets

AUTOMATED GENERATION OF ELECTRONICS SCHEMATICS WITH SINGLE WIRE TRACING

TECHNICAL FIELD

The present disclosure relates to a control system for generating electronics schematics. More specifically, the present disclosure relates to a control system configured to automate generation of metadata for an electronics schematic.

BACKGROUND

Machine technicians and engineers may use schematics as a map to identify and navigate electronics and electromechanical systems for maintenance, diagnosis, and other operations. Some schematics may be delivered to the user in electronic form and viewed on a hand-held or other types of computing device such as a tablet, a desktop or laptop computer, or other interactive screen. While using the electronics schematic, the technician may manually trace a line of an electronic circuit to identify a connecting point of the line, to evaluate systems and sub-systems that may be affected by that line, and to identify a source and termination point for the line of interest. Tracing a line in a schematic can be time consuming and technically challenging when a circuit includes a dense layout of electronics components.

Some systems for interactive electronics schematic delivery may highlight a circuit when selected by the technician using the hand-held device. This can make navigation of dense circuits easier for technicians by tracing the line through the circuit when selected, and highlighting the line of interest by changing the color and/or luminance of the line. The electronics schematic is limited, however, to the extent to which the circuit is dissected and programmed on the front end by a programmer, to create the interactive schematic objects for use by the technician. For example, the schematic objects may be circuits or portions of circuits in the schematic that are selectable by the user to highlight or manipulate the circuit depiction in some way. Conventional systems may produce electronics schematic files with manual programming steps, where the schematic files are executable by the viewing device to present user-selectable circuits that perform in certain ways when selected by a technician. Because conventional generation of electronics schematics that provide electronic circuit navigation is labor intensive, and the generation of the electronics schematic requires manual programming steps, there may be limited electronics schematics files available for some machine and circuit designs.

An example system for electronic circuit navigation is U.S. Pat. No. 8,214,789 (referred to hereafter as "the '789 reference"). The '789 reference describes a system for navigating objects in an electronics schematic diagram. The navigable objects may be lines in a circuit that can be selected in response to a keyboard input from a technician. In the '789 reference, a selected object may change color when selected to highlight the selected object. The '789 reference does not, however, include a system for generating the electronics schematic, but instead likely relies on one or more programmers to generate the schematic with manual programming steps.

Example embodiments of the present disclosure are directed toward overcoming the deficiencies described above.

SUMMARY

In an aspect of the present disclosure, a method includes sorting, with a processor, a plurality of objects in an electronics schematics file into predetermined categories. The processor determines a first association of a first line object of the plurality of objects, and a first pin object of the plurality of objects. The first the association indicates that the first line object and the first pin object are part of a single line. The processor determines a second association between a circuit start point of the plurality of objects and the first pin object. The second association indicates that the circuit start point and the first pin object are part of the single line. The processor determines a circuit end point of the plurality of objects, where the circuit end point is part of the single line. The processor forms a first circuit line group that includes the first line object, the first pin object, the circuit start point, and the circuit end point. The processor forms a second circuit line group including at least one second line object, and a second pin object. The second circuit line group is exclusive of the first circuit line group. The processor generates an electronics schematic output file that maintains the first association and the second association. The electronics schematics output file is configured such that, when executed by the processor, the first circuit line group is presented with user-selectable single line tracing.

In another aspect of the present disclosure, an electronics schematic generation system includes a memory, a display, and a processor connected with the memory and display. The processor sorts a plurality of objects in an electronics schematics file into predetermined categories. The processor determines a first association of a first line object of the plurality of objects, and a first pin object of the plurality of objects. The first the association indicates that the first line object and the first pin object are part of a single line. The processor determines a second association between a circuit start point of the plurality of objects and the first pin object. The second association indicates that the circuit start point and the first pin object are part of the single line. The processor determines a circuit end point of the plurality of objects, where the circuit end point is part of the single line. The processor forms a first circuit line group that includes the first line object, the first pin object, the circuit start point, and the circuit end point. The processor forms a second circuit line group including at least one second line object, and a second pin object. The second circuit line group is exclusive of the first circuit line group. The processor generates an electronics schematic output file that maintains the first association and the second association. The electronics schematics output file is configured such that, when executed by the processor, the first circuit line group is presented with user-selectable single line tracing.

In another aspect, a non-transitory computer-readable medium includes instructions for generating an electronics schematic. The instructions are executable by a processor to perform steps including sorting a plurality of objects in an electronics schematics file into predetermined categories. The processor determines a first association of a first line object of the plurality of objects, and a first pin object of the plurality of objects. The first the association indicates that the first line object and the first pin object are part of a single line. The processor determines a second association between a circuit start point of the plurality of objects and the first pin object. The second association indicates that the circuit start point and the first pin object are part of the single line. The processor determines a circuit end point of the plurality of objects, where the circuit end point is part of the single line.

The processor forms a first circuit line group that includes the first line object, the first pin object, the circuit start point, and the circuit end point. The processor forms a second circuit line group including at least one second line object, and a second pin object. The second circuit line group is exclusive of the first circuit line group. The processor generates an electronics schematic output file that maintains the first association and the second association. The electronics schematics output file is configured such that, when executed by the processor, the first circuit line group is presented with user-selectable single line tracing.

DETAILED DESCRIPTION

Figure 1:
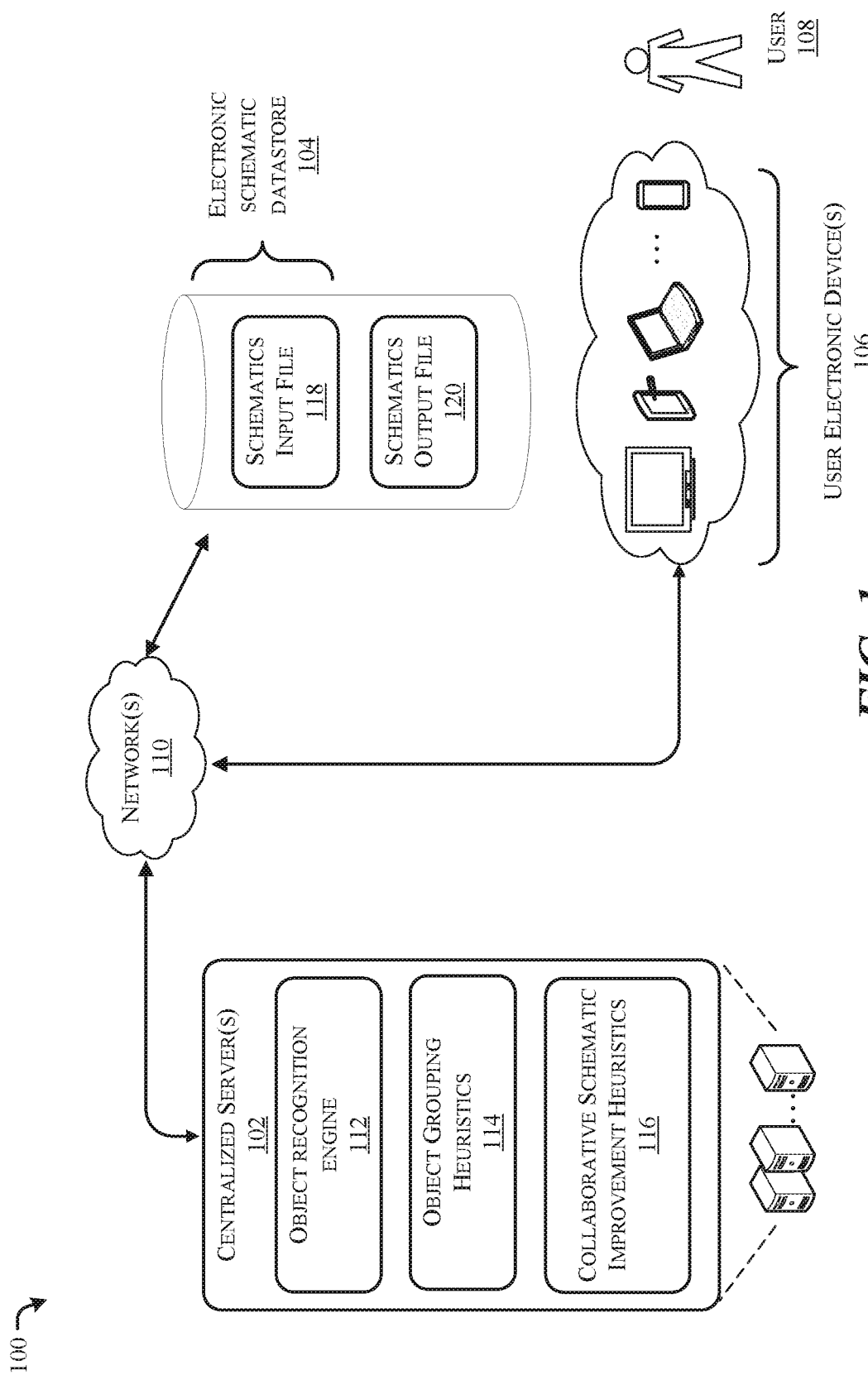
FIG. 1 is system diagram of an example computing environment for practicing embodiments of the present disclosure.

Wherever possible, the same reference numbers will be used throughout the drawings to refer to the same or like parts. FIG. 1 shows an exemplary computing environment 100. The computing environment 100 can include one or more centralized servers 102, an electronics schematic datastore 104, one or more user electronic devices 106. One or more users 108 (hereafter "user 108") may operate an electronic device of the user electronic devices 106 (hereafter "electronic device 106"). The centralized server 102, electronics schematic datastore 104, and the user electronic device 106 may be operatively connected via one or more networks 110.

The centralized server 102 may be configured to perform one or more aspects of generating the electronics schematics with single wire tracing. For example, the centralized server 102 (described hereafter as "server 102") can include a plurality of software engines, modules, and/or other computer program code configured to perform heuristics described with respect to embodiments of the present disclosure. For example, the centralized server 102 may include an object recognition engine 112, object grouping heuristics 114, and collaborative schematic improvement heuristics 116. Although other software and hardware modules may be included (described hereafter with respect to FIG. 2), it should be appreciated that the computer program product may be segmented into three main functional groupings as shown in FIG. 1.

The object recognition engine 112 may be configured to perform analysis of metadata in one or more schematics input files 118. The metadata in the schematics input files 118 can include line information, text information, and other data associated with a scalable vector graphics (SVG) files. The schematics input files 118 may be stored in a datastore operatively connected with the centralized server 102 such as, for example, the electronics schematic datastore 104 (hereafter "datastore 104"). As used herein, an object refers to a data object associated with a SVG file. An SVG file may be a XML-based vector image format for two-dimensional graphics with support for interactivity and animation. SVG images and their behaviors are defined in XML text files. This means that they can be searched, indexed, scripted, and compressed according to standard definitions functional as part of XML file programs. As XML files, SVG images can be created and edited with any text editor, as well as with drawing software. Objects, as used herein, may represent one or more electronics objects commonly found an in an electronics schematic. For example, an object may include a representation of a wire or line, a representation of a data bus, a representation of a pin for connecting a wire to another object, a representation of an electronics module such as, for example, a microchip, microelectronics circuit, or other module, a representation of a switch, a representation of an electronics hardware component, etc. As used herein, an object may also include a functional description of a circuit portion such as, for example, a circuit starting point, a circuit ending point, a truncated line, a grounding line, etc.

It should be appreciated that, as used herein, two-dimensional graphics represent geometric shapes in bi-dimensional space such that a position of an object (e.g., a point, line, segment, spline, etc.) may be describable, in an electronic graphics file, using coordinates in two-dimensions. The geometric shapes may be organized as groups, objects, and alpha-numeric string data, such that they have meaningful associations between the geometric shapes and their relative grouping with other geometric shapes described in the SVG file.

Accordingly, the object recognition engine 112 may be configured to parse the code associated with the SVG images in the schematics input file 118, and recognize the objects from geometric representations in the electronics schematic. For example, a graphic symbol may be an industry-standard representation of a particular type of electronic component in an electronics schematic. In one example embodiment, the object recognition engine 112 may parse the code associated with the SVG image, and recognize that the lines defined in the code are a resistive object of some sort (e.g., lines organized into a zig-gag pattern, or as a rectangle overlapping a line representing a circuit wire, which are commonly associated with a schematically-represented resistor). Accordingly, the object recognition engine 112 may create a data structure (e.g., a lookup table or other data structure) that associates the line segments forming the zig-zag pattern (or alternatively, a rectangle) of the SVG image with a data structure indicative of an object called "resistive object."

Other methods of character recognition are contemplated. Those skilled in the art appreciate that character recognition can include a plurality of known steps and technologies for parsing raster vector files, or other files, interpreting grouped geometry into meaningful symbols, recognizing the symbols, and generating structures that map the groupings of symbols to known alpha-numeric characters (e.g., text, numbers, etc.) or other objects. Similarly, the object recognition engine 112 may parse the SVG image data in the schematics input files 118 and identify objects that are represented in the electronics schematic.

The object grouping heuristics 114 may be configured to group recognized objects into predetermined categories of objects that define organizational, functional, structural, and other aspects of the electronic components as they relate to the electronics schematic represented in the SVG file. For example, the object grouping heuristics 114 may be configured to determine whether the metadata that defines a line object in the input SVG file is associated with another object (such as, for example, a geometric shape defining a pin, a line representing a circuit bus, a geometric symbol indicative of a switch, etc.) to which the line may be connected. The object grouping heuristics 114 may associate objects into functional groups in various ways. For example, in one aspect, the centralized server 102 may associate a objects to other objects based on text labels of the respective objects, based on distance relationships of the geometry of the objects, based on line weights in the SVG file, and in other ways.

Figure 7:
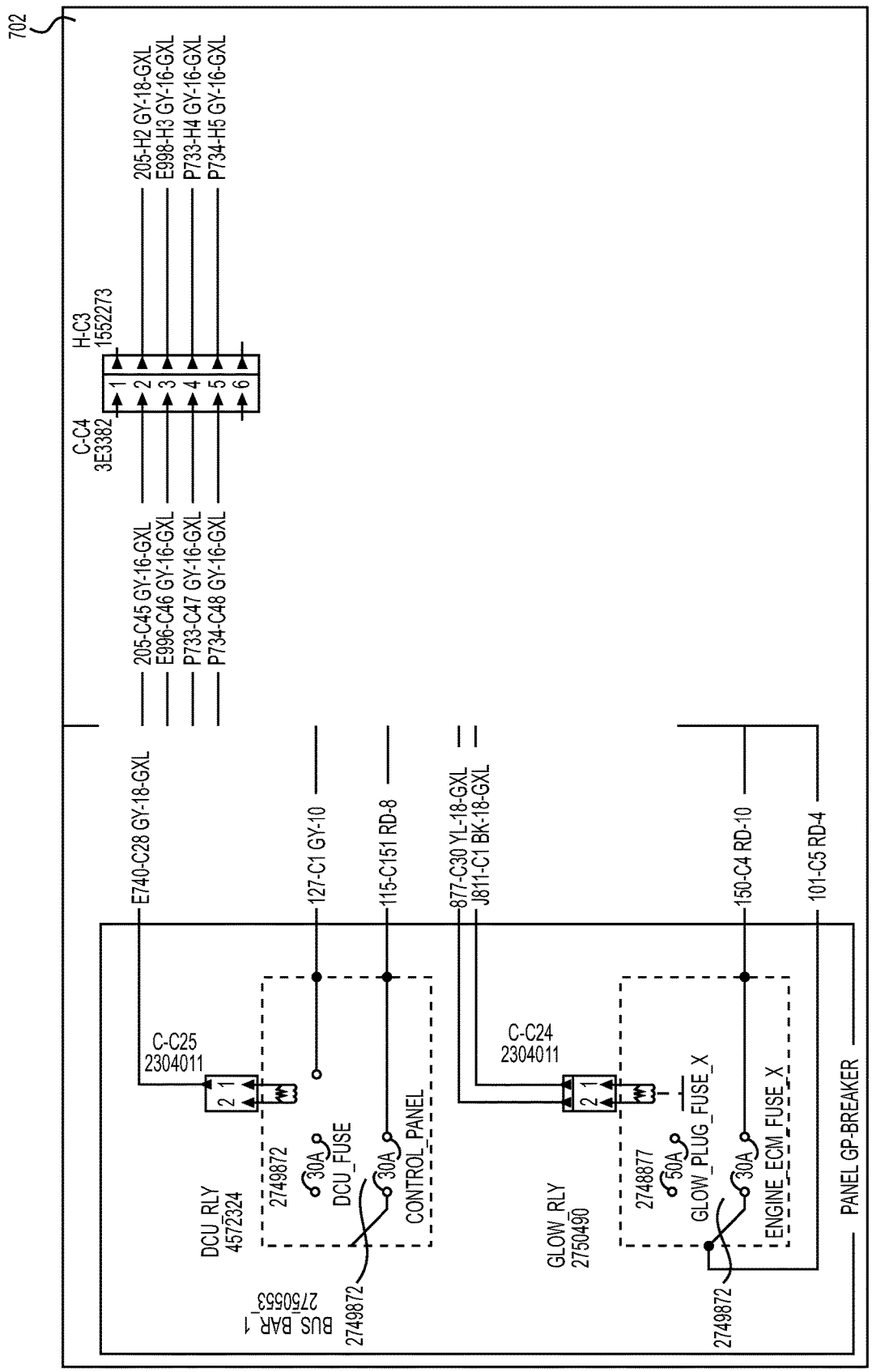
FIG. 7 is yet another schematic illustration of an example step for generating an electronics schematic according to an example embodiment of the present disclosure.
Figure 8:
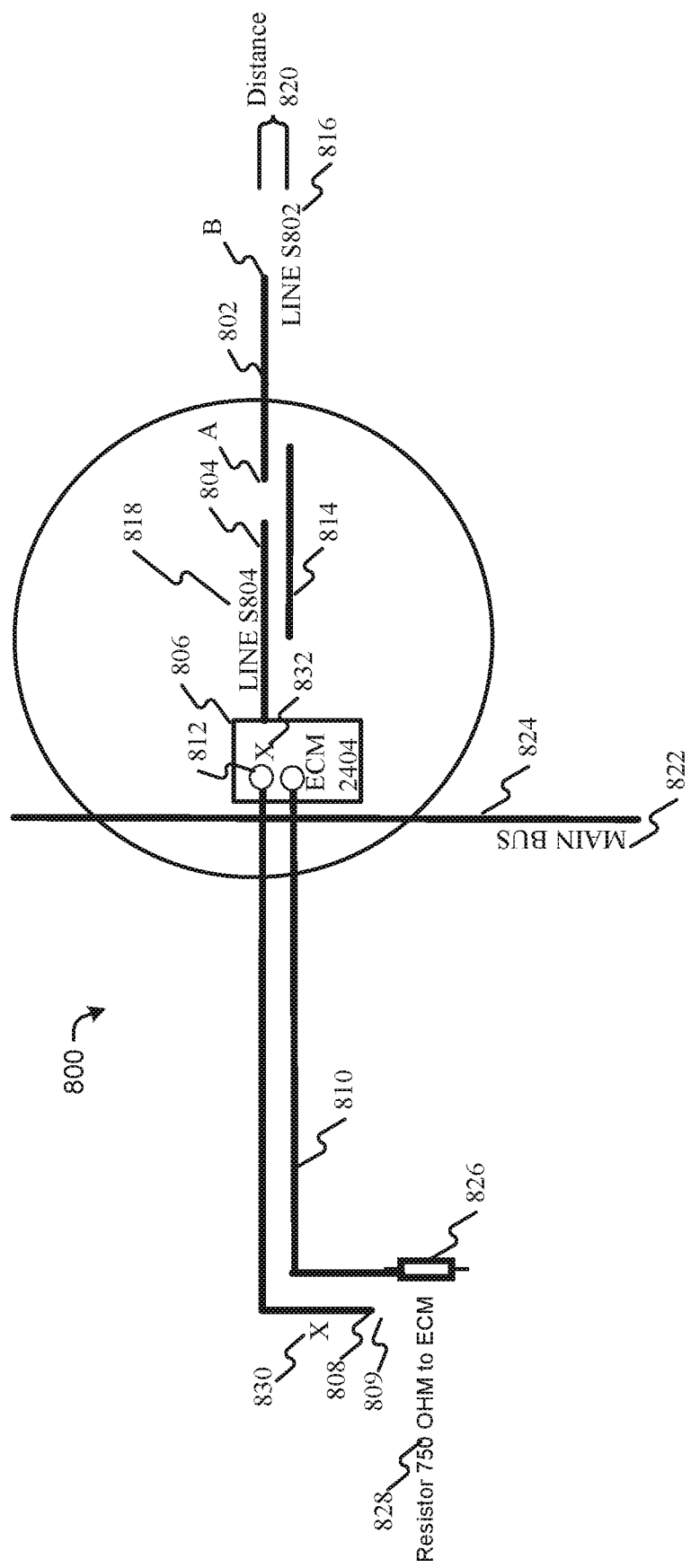
FIG. 8 is a schematic illustration of another example step for generating an electronics schematic according to an example embodiment of the present disclosure.

Although FIGS. 1-7 will be discussed in detail hereafter, FIG. 8 is first considered as an example circuit portion 800 that may be helpful to understand some aspects of the present disclosure. Referring briefly to FIG. 8, the circuit portion 800 of an electronics schematic is depicted. The circuit portion 800 includes a line object 802 and a line object 804. As introduced above, the line objects 802 and 804 may be embodied in the SVG input file as geometry representing portions of an electronics circuit. The object grouping heuristics 114 may recognize objects by evaluating the geometry of the lines and text in the SVG file, and group recognized objects into predetermined categories that define organizational, functional, structural, and other aspects of the electronic components as they relate to the electronics schematic represented in the SVG file.

In one aspect, the object grouping heuristics 114 may analyze relationships between the geometry that depicts one or more of the electronics objects in a schematic. The relationships of the electronics objects can indicate one or more objects that are part of the same circuit line, and indicate the objects that are not part of the circuit line. In one aspect, an association between objects is discernable by the server 102 based on an orientation of one object with respect to the other. For example, the line object 802 and the line object 804 may have an unknown association with one another (unknown based on the metadata tags determined by the object recognition engine 112). In one aspect, the line object 802 may be related to the line object 804 (related as being a continuous single line) if both line objects 802 and 804 overlap at some point in their geometry. That is to say, the line objects 802 and 804 are coterminous if at least one portion of two or more of the lines at issue overlap one another. As shown in FIG. 8, no portion of the geometry of line objects 802 and 804 are coterminous.

However, the line object 802 and the line object 804 may still be associated and part of a single line of a circuit. In another aspect, the line objects 802, 804 may be associated when they are substantially parallel but unconnected. For example, if one or the other of the two line objects 802 and 804 were extended, (e.g., if line object 802 were extended at point A) the line objects 802 and 804 would overlap. The term "substantially parallel," as used in this example, means, that the lines form an angle between them, and that angle is less than a predetermined range of angles. For example, the line objects 802 and 804 may be substantially parallel when the angle between them is less than 0.25 degrees, 0.125 degrees, or another predetermined angle. As explained hereafter, there are other ways in which the server 102 may determine that objects are or are not associated with each other, and thus, are part of a single line in the electronics circuit.

Objects in the SVG file may be circuit wires, pins to which the circuit wires connect, switches, microelectronic circuits (chips), and other types of devices. Accordingly, the server 102 may form associations between line objects with connecting pins. In another aspect, the object grouping heuristics 114 may associate one or more lines with one or more pins connecting the lines to respective component objects represented in the SVG file, and create a data structure that associates the objects as a circuit line group. Referring to FIG. 8, a pin object 812 is shown with a circuit block object 806. In one example, the object grouping heuristics 114 may associate the line object 808 with the pin object 812. The association of the line object 808 and the pin object 812 indicates that the objects may be connected and part of the same circuit line group.

As used herein, a circuit line group may be one or more objects that represent a continuous line in an electronic circuit. For example, a technician may commonly consult an electronics schematic to trace a single line to its source on the schematic. In an example embodiment shown in FIG. 8, the object grouping heuristics 114 may group line objects 802, 804, and 808 to one or more pin object 812, and identify a circuit start 809 and a circuit end point associated with the line objects 802, 804, and 808. Accordingly, the object grouping heuristics 114 may generate the schematics output file 120 that includes the circuit objects that form a single line circuit. The circuit objects may be, for example, the line object 802, which may represent a wire in the circuit, the line object 804, which may represent another leg of the same wire in the circuit, the pin object 812, which may represent a pin to which the wire (exemplified as the line objects 802 and 804) is connected, and the circuit block object 806, associated with as part of a schematics output file 120. The centralized server 102 may store the schematics output file 120 in the electronics schematic datastore 104. The schematics output file 120 is operable on a user device to present a user-selectable single line group in an electronics schematic.

Referring again to FIG. 1, the centralized server 102 may generate the schematics output file 120, and mis-identify one or more objects as part of a single line group in error. In one aspect, the centralized server 102 may include collaborative schematic improvement heuristics 116 that can coordinate collective improvements to the schematics output file 120 by one or more other users (such as, for example, the user 108). Referring again to FIG. 8, an erroneously-associated object may be, for example, the non-connected line object 814. As an example, the non-connected line object 814 may be a non-connected line (that is not part of the single line circuit that includes e.g., the line object 802, the line object 804, the pin object 812, and the circuit block object 806), but identified by the server 102 as an associated line object that is part of the circuit line group. If the centralized server 102 were to erroneously include the non-connected line object 814 in the single line circuit group, the collaborative schematic improvement heuristics 116 can coordinate edits to the server 102-generated output file. For example, the user 108 may determine, through use, that the non-connected line object 814 is associated with the line group depicted in FIG. 8 in error. In one aspect, the collaborative schematic improvement heuristics 116 may receive feedback from the user 108, (e.g., via an email from the user 108) and feedback from another user (not shown), where both feedback are indicative of an erroneous association between the circuit group (which in this example includes the line objects 802, 804, 808, and 810, the pin object 812, and circuit block object 806), and the non-connected line object 814.

In another example, the collaborative schematic improvement heuristics 116 may edit the schematics output file 120 based on the collaborative feedback from the one or more users 108 by removing the data in the schematics output file 120 that associates the mis-identified line (e.g., the non-connected line object 814) to the circuit line group, and adding the non-connected line object 814 to another group of un-associated objects (that are not the circuit line group). In another embodiment, the collaborative schematic improvement heuristics 116 may edit the schematics output file 120 based on a number of feedback communications that meet a predetermined threshold for number of feedback communications, where each of the feedback communications associate the same object with one or more of the same circuit line groups. Editing the schematics output file 120 can include changing an object or a group of objects from a circuit line group to another circuit line group.

In another aspect, the collaborative schematic improvement heuristics 116 may receive the feedback communications from the one or more users 108, and based at least in part on determining that a threshold for total number of feedback communications having the same error identified may be met, generate a service message to schematic editing personnel, where the message identifies the erroneous circuit line group, and/or identifies a correct circuit line group with which the object should be associated. A correct circuit line group can be defined, for example, by a predetermined number of similar or identical circuits noted in the two or more feedback communications from the users 108.

With continued reference to FIG. 1, the electronics schematics may be generated on a user electronic device 106 by opening the schematics output file 120 with an electronic device of the user electronic devices 106. As described hereafter, the user electronic device 106 may be any device configured to receive input from an operator such as, for example, the user 108, and generate an interactive SVG file that provides a user-selectable circuit line group. The input described herein may be a user selection by keyboard, screen touch/selection, voice input, gesture input, or another input mechanism known in the art. A user selection means that a user 108 has provided input to the user electronic device 106, in some form, where the input indicates a user selection of one or more objects that are part of the circuit line group. Using the prior example in FIG. 8, a circuit line group could include the line objects 802, 804, and 810, the circuit block object 806, the circuit start point 809, and the pin object 812, because the respective line objects, pin objects, etc., are used by the processor 204 to form associations indicative of a single circuit line.

Figure 2:
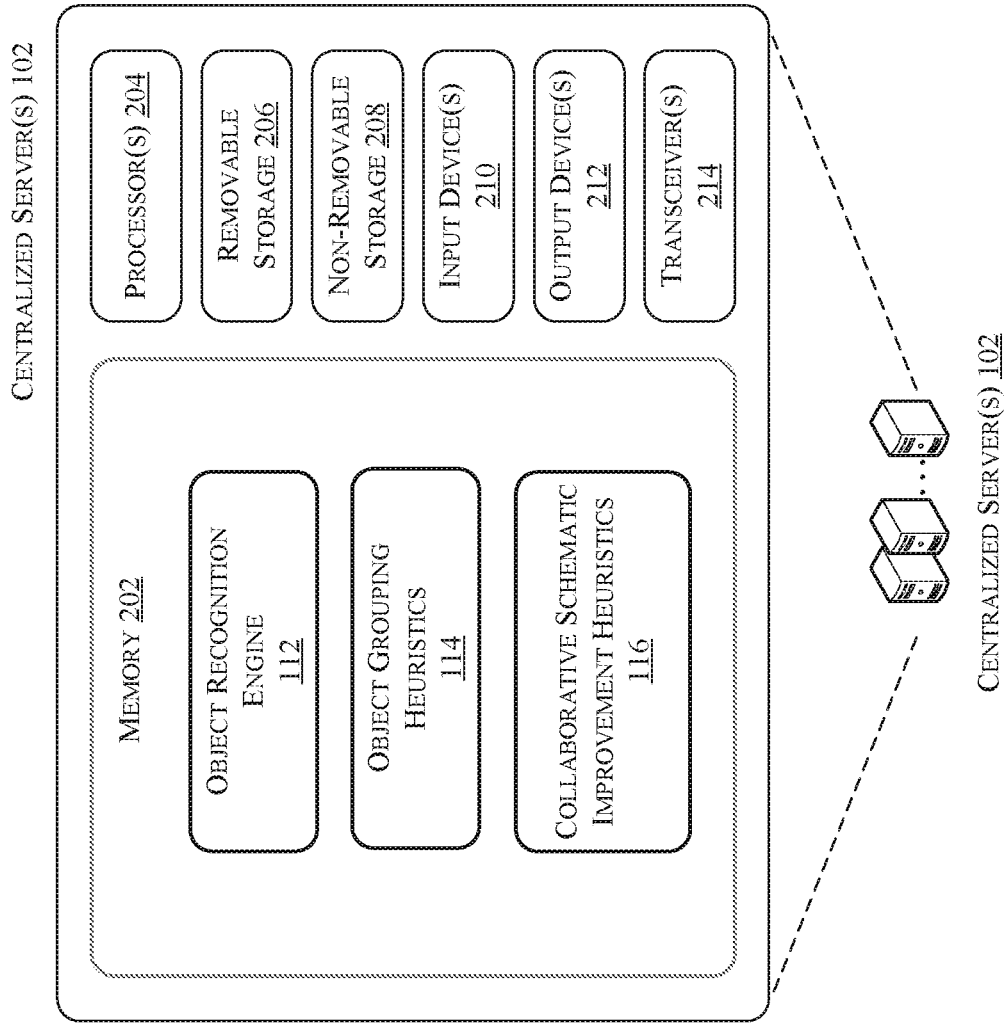
FIG. 2 is a block diagram schematically representing a centralized server in accordance with an example embodiment of the present disclosure.

FIG. 2 is a block diagram schematically representing the centralized server 102, in accordance with an example embodiment of the present disclosure. The centralized server 102 of FIG. 1 can be/correspond to the centralized server(s) 102 of FIG. 1, and may be used to implement the various operations described herein. In example embodiments, the centralized server 102 can be implemented as a single device or as a plurality of devices with modules and data distributed among them. For example, the centralized server 102 may include memory 202 storing the object recognition engine 112, the object grouping heuristics 114, and the collaborative schematic improvement heuristics 116, among other software modules. Also, the centralized server 102 can include the processor 204, a removable storage 206 and non-removable storage 208, input device(s) 210, output device(s) 212, and/or transceiver(s) 214.

In various embodiments, memory 202 may be volatile (such as RAM), nonvolatile (such as ROM, flash memory, etc.) or some combination of the two. The object recognition engine 112, the object grouping heuristics 114, and/or the collaborative schematic improvement heuristics 116 stored in the memory 202 can comprise methods, threads, processes, applications or any other sort of executable instructions. The object recognition engine 112, the object grouping heuristics 114, and/or the collaborative schematic improvement heuristics 116 can also include files and databases. Details of the object recognition engine 112, the object grouping heuristics 114, and the collaborative schematic improvement heuristics 116 are provided above in the discussion of FIG. 1.

In some embodiments, the one or more processor(s) 204 are central processing units (CPUs), graphics processing units (GPUs), or both CPU and GPU, or other processing units or components known in the art.

The centralized server 102 may also include additional data storage devices (removable and/or non-removable) such as, for example, magnetic disks, optical disks, or tape. Such additional storage is illustrated in FIG. 1 by the electronics schematic datastore 104. Tangible computer-readable media can include volatile and nonvolatile, removable and non-removable media implemented in any method or technology for storage of information, such as computer readable instructions, data structures, program modules, or other data. The memory 202, removable storage 206 and non-removable storage 208 are all examples of computer-readable storage media. Computer-readable storage media include, but are not limited to, RAM, ROM, EEPROM, flash memory or other memory technology, CD-ROM, digital versatile discs (DVD), content-addressable memory (CAM), or other optical storage, magnetic cassettes, magnetic tape, magnetic disk storage or other magnetic storage devices, or any other medium which can be used to store the desired information and which can be accessed by the centralized server 102. Any such tangible computer-readable media can be part of the centralized server 102.

The centralized server 102 also can include input device (s) 210, such as a keypad, a cursor control, a touch-sensitive display, voice input device, etc., and output device(s) 212 such as a display, speakers, printers, haptic feedback, etc.

As illustrated in FIG. 2, the centralized server 200 may include one or more wired or wireless transceiver(s) 214. For example, the transceiver(s) 214 can include a network interface card (NIC), a network adapter, a LAN adapter, or a physical, virtual, or logical address to connect to the one or more network(s) 110, and the user electronic devices 106. To increase throughput when exchanging wireless data, the transceivers 214 can utilize multiple-input/multiple-output (MIMO) technology. The transceiver(s) 214 can comprise any sort of wireless transceivers capable of engaging in wireless, radio frequency (RF) communication. The transceivers 214 can also include other wireless modems, such as a modem for engaging in Wi-Fi®, WiMAX®, Bluetooth®, or infrared communication.

Figure 3:
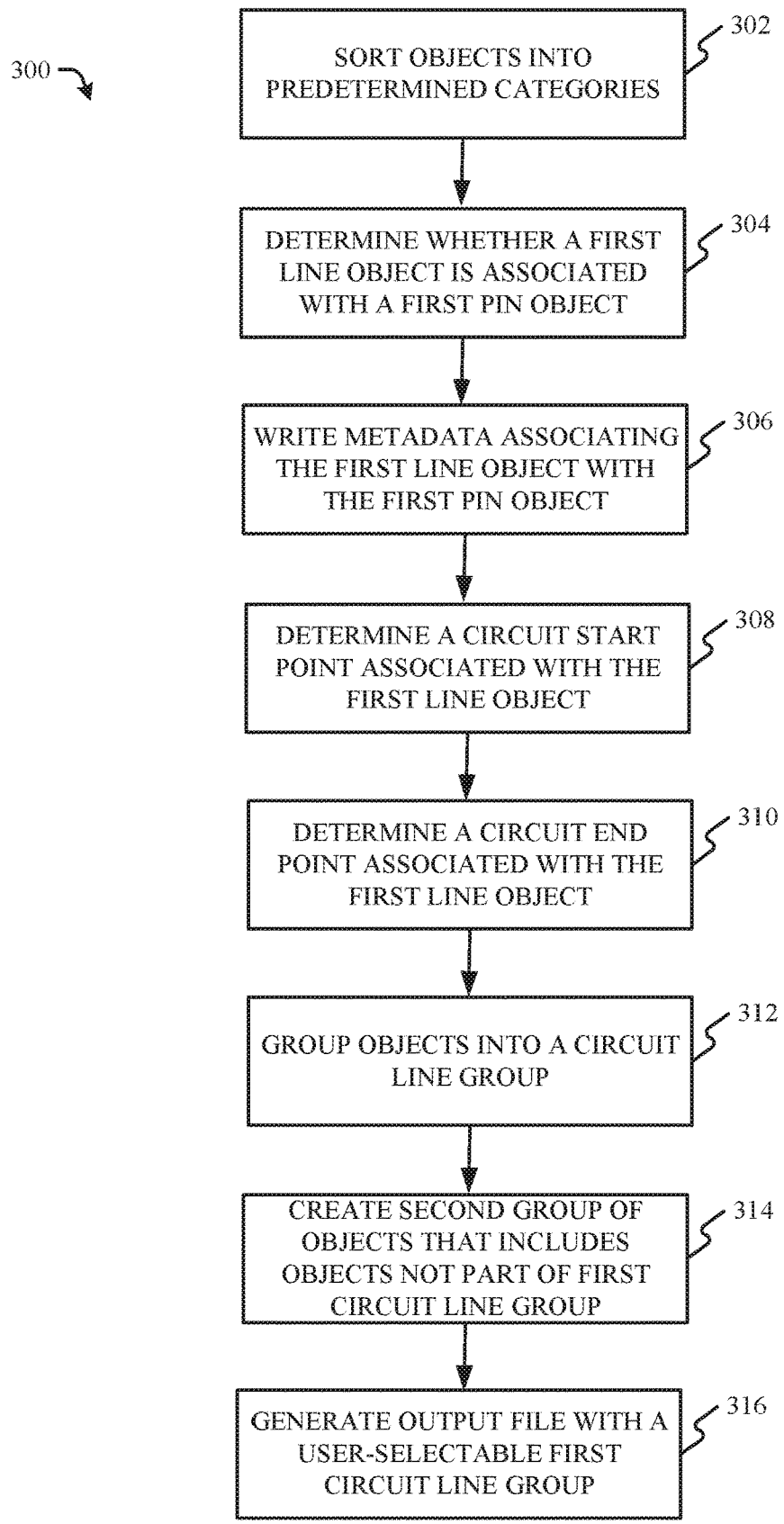
FIG. 3 is a flow chart depicting a method of generating an electronics schematic with single wire tracing in accordance with an example embodiment of the present disclosure.

Embodiments of the present disclosure can streamline generation of interactive electronics schematics. FIG. 3 is a flow chart depicting a method 300 for generating an electronics schematic with single wire tracing, in accordance with an example embodiment of the present disclosure. The output generated by embodiments of this disclosure, such as the method 300, can receive inputs from the user 108, where the inputs indicate a user selection of a particular line in the electronics schematic. In one aspect, the schematics output file 120 includes instructions that, when executed by a processor of the user electronic device 106, cause the processor of the user electronic device 106 to generate an electronics schematic with the selected circuit (or selected line within the circuit), where the selected portion is highlighted in a color (e.g., a first color) that is different from a color (e.g., a second color) and/or luminance associated with the surrounding circuit portions. For example, the selected line may be highlighted in a first color that is brighter (having a higher luminance) than a second color of and/or associated with surrounding circuit portions that are not logically connected to the selected line. For example, the selected circuit may be displayed in bright red, where the remaining objects of the electronics schematic are grayed out and darker in luminance than the selected circuit.

In another embodiment, the selected line may be unselected by repeated user-selection, where the second selection of the same line toggles the line off and on by highlighting the line when user-selected, and un-highlighting the line when user-selected a second time. By highlighting the selected line and all connected lines in the same circuit, the technician can save time by avoiding the tracing associated with conventional circuit schematic interpretation.

Generating the schematics output file 120 can include, for example, reading in the schematic file by the object recognition engine 112. The schematic file may be an SVG file as discussed previously. For example, the object recognition engine 112 may load the schematic input file 118 into the memory 202 from the removable storage 206, non-removable storage 208, or another connected computer readable memory. Alternatively, the processor 204 may work directly from the removable storage 206. The processor 204 may parse the electronics schematics file to identify a line object from a plurality of line objects that are associated with the electronics schematic components that are in the schematics input file 118. Using FIG. 8 again as an example, the schematics input file 118 may represent a circuit portion 800 with a main bus object (e.g., the main bus geometry 820) connecting to a circuit switch, where the bus object terminates into a circuit block object 806. By parsing the SVG input file, the processor 204 may recognize the geometry that constitutes the switch object as a switch, and recognize the main bus geometry 824 as a circuit bus, etc. In other aspects, the processor 204 may recognize the objects using other methods discussed herein, such as parsing text strings, which may be and/or include alpha-numeric or other symbolic characters, and using the text strings, alpha-numeric, or other symbolic characters to associate objects with known categories of electronics components.

The object recognition engine 112 may evaluate one or more objects identified by the processor 204 after parsing the SVG file(s) associated with the schematics input files 118, where the evaluation may be made in different ways. For example, referring again to FIG. 8, the line objects 802 and 804 may include alpha-numeric string data 816 and 818. The alpha-numeric string data 816, and 818 may be text or other string data. As shown in the example of FIG. 8, the processor 204 may associate geometry using words or coded numbers that identify each line or component. For example, by evaluating the line objects 802 and 804 the processor 204 may determine that the line objects 802 and 804 are line objects because their geometry include a starting point, an ending point, spline data, coordinate information, or other information known in the art to describe line geometry in an SVG file. In another aspect, the processor 204 may parse the SVG file and evaluate an object type of the line object 802 and the line object 804 using an alpha-numeric string associated with each of the line objects. For example, the alpha-numeric string data 816 reads "LINE S802" and the alpha-numeric string data 818 reads "LINE S804." The processor 204 may evaluate the distance 820 between the alpha-numeric string data 816 and the line object 802, and determine that the alpha-numeric string data 816 may be associated with the line object 802 because it may be located within a predetermined distance 820 from the line object 802. The alpha-numeric string data 816 may be, for example, a code or name associated with a line object 802, where the code or name of the line (e.g., the alpha-numeric string data 816) may be printed proximate to the particular line object of interest (e.g., the line object 802) in the SVG file (of which the circuit portion 800 may be a part). For example, a main bus may include the alpha-numeric string 822 "MAIN BUS" proximate to a portion of the main bus geometry 824. Accordingly, the main bus geometry 824 may, within a range of predetermined probability, relate to the alpha-numeric string data 822 "MAIN BUS," 822 and the processor 204 may create an association between the object type "main bus" with the geometry forming the line at issue (e.g., the main bus geometry 284). In another aspect, the processor 204 may determine that there is an association between text data and line or other objects because the string data is disposed parallel to and proximate to the object geometry. For example, the alpha-numeric string data 818 may be related to the line object 804 because the line object 804 is proximate to the alpha-numeric string data 818, and the alpha-numeric string data 818 and the line object 804 are substantially parallel.

As an example, the processor 204 may evaluate the distance 820 between a portion of a continuous line and an alpha-numeric string, and evaluate whether the alpha-numeric string has a likelihood of being associated with the line, where an association is made or not made by the processor 204 based on a predetermined threshold of likelihood. As shown in FIG. 8, the processor 204 may evaluate the distance 820, and determine that there is an association when the distance 820 is within a predetermined threshold of distances, where the smaller the distance, the greater the probability/likelihood of association between the text string and the object. A likelihood of association between objects can be determined in various ways. In one aspect, the processor 204 may consider two or more similar labels near (that is, within a predetermined coordinate distance from) a line of interest to weigh in favor of a relationship between the line and the alpha-numeric string of interest. In another aspect, indicia weighing in favor of an association between an alpha-numeric string and a particular object may include a descriptive label within the alpha-numeric string that matches the type of object drawn in the SVG file. For example, a resistive object 826 and the line object 810 may or may not be associated with the alpha-numeric string data 828 that reads "RESISTOR 750 OHM TO ECM." When the object of interest (e.g., the resistive object 826) is positively matched to an alpha-numeric string data 828, the processor 204 may form an association between the text in the alpha-numeric string data 828 and the resistive object 826, for example. In one aspect, the processor 204 may identify the resistive object 826 as a circuit resistor that is part of the single line circuit, and determine that the resistive object 826 is associated with touching (contiguous) line geometry (the line object 810). The processor 204 may form an association of the resistive object 826 to the line object 810, and determine that the line object 810 leads to an identified object called "ECM 2404," (depicted in FIG. 8 as the circuit block object 806). The processor 204 may form an association (a positive match) between the circuit block object 806, the line object 810 connected to the circuit block object 806, and the alpha-numeric string data 828 that reads RESISTOR 750 OHM TO ECM. The positive match may provide an adequate (that is, within a predetermined range of acceptable probability) indicia of association of the objects, where the indicia of association of the objects is indicative that the objects 806, 826, 828, and 810 are part of the same circuit line group.

As another example, two acknowledged facts may, in conjunction, provide indicia of association. Two acknowledged facts may be, for example, (1) the resistive object 826 is a resistor, and (2) the resistive object 826 touches a line object 810 known to lead to the circuit block object 806, which includes within its boundaries of geometry text that reads "ECM 2404". In the present example shown in FIG. 8, the two facts (1) and (2), in combination, may indicate a probability indicative of an association between the resistive object 826, the line object 810 of interest, and the ECM 2404 (the circuit block object 806) to which the line object 810 leads.

Moreover, even when there is a break in the geometry forming a line that leads to the circuit block object 806 (labeled "ECM 2404"), in some aspects, the processor 204 may still form an association between the objects. The processor 204 can make the association using the metadata associated with the objects, where the association is made based on the location in the file of the alpha-numeric string data and the object at issue. For example, the alpha-numeric string data 816 and 818 may be, for example text string data. The processor 204 may identify each respective object (e.g., the line object 802, and the line object 804) respectively proximate to the alpha-numeric string data.

In one aspect, the association is made when two or more of the objects are similarly labeled in the schematic to logically connect the objects, where the geometric connection of the lines may not exist. For example, the alpha-numeric string data 818 may be logically associated to the alpha-numeric string data 816, because both alpha-numeric string data 816 and 816 share the characters "LINE S80*" (where the * indicates a wildcard character that is not shared by the two alpha-numeric string data). As another example, the processor 204 may determine an association based on an identical label shared by two objects of interest, because the text LINE S80 is included in both alpha-numeric strings 816, 818, which are respectively located proximate to the line objects 802 and 804. In another aspect, two objects may be labeled with an identical number (that is, string information that includes a number is proximate to the geometry of the object of interest). Other methods of forming an association between circuit objects, text, and other aspects of the SVG file are contemplated. The processor 204 may form an association between the line objects 802 and 804, embed the formed association as metadata in the schematics output file 120, and save the output file 120 in the removable storage 206.

After describing steps for inputting a schematics input file 118, and parsing the file to identify objects in the schematics input file 118, we will now turn to FIG. 3 to describe steps in the method 300 for generating an electronics schematic (e.g., a schematics output file 120) with single wire tracing.

FIGS. 3-8 are considered together in the following discussion of the method 300. Looking first at FIG. 3, at block 302, the processor 204 may sort objects of a parsed SVG file into predetermined categories. The objects may be, for example, line objects, pin objects, circuit blocks, resistive objects, circuit start points, circuit end points, and other objects. Using FIG. 8 as an example, the processor 204 may sort the line objects 802 and 804, the pin object 812, the circuit block object 806, etc., into categories by evaluating each with respect to line geometry, alpha-numeric string data, symbolic information, and other criteria, and associate each object, block, object, etc., to a predetermined category. The categories, although not exhaustive list, may include horizontal lines (e.g., line objects 802, 804), vertical lines (e.g., the main bus geometry 824), diagonal lines (not shown), and connector pins (e.g., the pin object 812). Other categories of objects are contemplated. The categories of objects may be descriptive of an analogous electronic circuit elements in the electronics schematic.

At step 304, the processor 204 may determine whether a first line object (e.g., 802) is associated with a first pin object (e.g., the pin object 812). For example, referring again to FIG. 8, the line object 802 may have an end point A and a second end point B that are connected by the line object 802. The processor 204 may determine that the line of interest (e.g., the line object 802) is of the category horizontal, extending between two geometry end points A and B. Accordingly, the processor 204 may determine that the line of interest belongs to a group of objects sharing a category "horizontal line."

In another aspect the processor 204 may evaluate the pin object 812. The processor 204 may determine that the pin object 812 is associated with a particular geometric shape (e.g., a circle, as shown in FIG. 8), where the determination is based in part on a known relationship between that shape (a circle) with a category of line object (a pin connection in a circuit). The processor may associate the pin object 812 with a line object 808 if the processor 204 determines that they are connected (by touching, for example).

The processor 204 may determine that objects are associated by evaluating one or more indicia of association. For example, the processor 204 may determine that the line object 808 terminates proximate to or contiguous to a portion of the geometry forming the pin object 812. In the present example, one indicium of association can include an observation that the line object 808 terminates at pin object 812, where the end of the line object 808 touches a portion of the circle forming the pin object 812. This fact may indicate that the line object 808 is associated with the pin object 812, and thus, be an indicium of association of the line of interest (e.g., the line object 808) and the pin object 812.

As another indicium of association, the processor 204 may categorize the line of interest 804 as a horizontal line, where a theoretical point on the line object 804 intersects a center point of the pin object 812. For example, there may be a theoretical intersection between a center point of the geometry forming the pin object 812 and the line object 804 if the line object 804 were extended to the left, such that it would intersect the theoretical center of the pin object 812. This theoretical intersection of a center point of a pin and a point along a line object may be another indicium of association. The processor 204 may determine that the line object 808 terminates at a point coterminous with some portion of the geometry forming the pin object 812 (a second indicium), and the end point of the line object 808 does not continue past the coterminous point where the pin object 812 and the line object 808 intersect (a third indicium).

The processor 204 may associate each of the indicia of association a weighted value for indicia of association. The value may be stored as a predetermined list of geometric objects, and lists of factors that increase or decrease each indicium value for identifying a respective object. Accordingly, the processor 204 may evaluate whether a sum of the indicia values meets or exceeds a predetermined threshold of association values to determine whether the any two or more objects are associated. For example, each indicium of association may have a relative value that is weighted according to its relative accuracy, where the accuracy is indicative of a distance between the objects being evaluated, a number of digits of text that match, an angle formed between the geometric features, etc. The processor 204 may evaluate a sum of indicia values for the indicia of association. Based at least in part on determining that the sum exceeds a predetermined threshold, the processor 204 may determine that the line object 802 is associated with the pin object 812, as shown at step 304 of FIG. 3.

At step 306 of FIG. 3, the processor 204 may write metadata indicative of an association of the first line object with the first pin object. For example, the object grouping heuristics 114 may determine that the first line object is associated with the first pin object, and write a value to a lookup table, where the value uniquely identifies the first line object and uniquely identifies the pin object. The object grouping heuristics 114 may associate, in the lookup table, the first line object and the first pin object, and record the association in the lookup table. The lookup table may be part of the schematics output file 120, and may be stored, for example, in non-removable storage 208.

At step 308, the processor 204 may determine a circuit start point associated with the first line object. A circuit start point may be, for example, a point in the schematic identifying a beginning of the circuit represented by the schematic. For example, as shown in FIG. 8, the line object 808 may be a circuit start point (e.g., the circuit start point 809). In one aspect, the processor 204 may determine that a line (e.g., the line object 808) is associated with the circuit start point 809 when the circuit portion 800 does not include further connecting lines, components, objects, etc., at any point further than the circuit start point. That is to say, the circuit start point 809 is a point indicative of an end of the line object 808 (or conversely, a beginning of the line object 808). In other aspects, the processor 204 may determine that an end point of a line is a circuit start point based on a connection with an identified power source object (not shown).

In another aspect, the processor 204 may identify the circuit start point 809 by parsing at least one text string (e.g., the alpha-numeric string data 832) in the electronics schematics file to identify alpha-numeric metadata associated with the pin object 812. The processor 204 may then identify the alpha-numeric string data 830 associated with the circuit start point 809, and determine whether the pin object 812 is associated with the circuit start point 809 based on alpha-numeric string data 830 (which may be, for example, string data) that indicates the circuit start point 809, and further based on the alpha-numeric string data 832 indicative of the pin object 812. Stated another way, the metadata associated with both the circuit start point 809 and the pin object 812 in the schematics input file 118 may identify the association of those objects in some way. In the present example, both alpha-numeric string data 830, 832 read "X", which may be an indicium of association. The association may be identified by common numbers, symbols, text, etc.

In another aspect, when the processor 204 associates both of the line object 808 and the pin object 812, (for example, because they are touching) they are said to be coterminous. Based at least in part on determining that the circuit start point 809 and the pin object 812 are coterminous, the processor 204 may write information to the schematics output file 120 indicative of a pin-start association.

At step 310, the processor 204 may determine a circuit end point associated with the first line object. For example, using the circuit portion 800 as shown in FIG. 8 as an example, the processor 204 may determine that an end point B of the line object 802 is a circuit end point based on a connection to an identified ground object (not shown). In yet another example, the processor 204 may evaluate the line ending or beginning based on a relative line thickness of the line object with respect to line thicknesses of contiguous line objects. For example, if a line having a line thickness x touches a line having a thickness 2.5×, the thicker of the two lines may indicate a predictable relationship between the objects. An example predictable relationship may be a circuit bus connecting the lines to a power source may be an indicium of a circuit start, whereas a line thickness x touching a line having a thickness of x and leading to a ground symbol may be an indicium of a circuit endpoint. Other circumstances are contemplated.

At step 312, the processor 204 may group objects into a circuit line group. A circuit line group may include metadata identifying each of the objects that the processor 204 associates with one another, as described above. For example, looking again at FIG. 8, the processor 204 may determine that the pin object 812 is associated with the line object 808, a circuit start point (also line object 808), and a circuit end point (point B of line object 802). By associative logic, the processor 204 may include all circuit objects that exist between the circuit start point 809 and the circuit end point B as objects positively associated with the circuit line group (a single line in the schematics file). For example, if the line objects 808 and 802 are positively identified by the processor 204 as being associated with the circuit line group, objects that are connected to the line object 808 and the line object 802, and/or are between the line object 808 and the line object 802, by association with the line objects 808 and 802, may be part of the circuit line group. For example, the circuit line group of FIG. 8 may include the line object 804.

After forming a circuit line group of associated objects, the processor 204 may form a second group that includes all objects that are not part of the first group. That is, there may be a first circuit group of objects, and a second circuit group of any circuit objects, objects, alpha-numeric string data, and other information in the schematics input file 118 that is not part of the first circuit group of objects. Accordingly, when outputting the selected circuit group, the processor may assign a predetermined pixel color and luminance to the selected circuit group, and output the second group at a lesser luminance and with a different color. As shown in FIG. 8, the non-connected line object 814 and the main bus geometry 824 may not be part of the first circuit group. Accordingly, the processor 204 may add the non-connected line object 814 and the main bus geometry 824 to the second circuit line group.

At step 316, the processor 204 may generate the schematics output file 120. The schematics output file 120, when executed by the user electronic device 106, may receive a user selection by a user 108. When the user electronic device 106 executing the schematics output file 120 receives the user selection, the user electronic device 106 may present, based at least in part on the user selection, the first circuit line group on the display of the user electronic device 106. The first circuit line group may be presented on the display of the user electronic device 106 in a different color than the color of the second circuit line group.

After an initial description of steps for generating the schematics output file 120, FIGS. 4-9 describe aspects of the steps described above in different detail. Starting first with FIG. 4, an illustration of an input schematics file 400 is depicted, according to an example embodiment of the present disclosure. The input schematics file 400 includes a plurality of circuit objects in an SVG file that is read into the memory 202 via the one or more input devices 210. The input schematics file 400 includes a plurality of circuit objects that can include a circuit line object 402A, a second leg of the circuit line object 402B, a pin object 404, and a connecting circuit object 406. The first leg of the circuit line object 402A may include metadata in the form of an alpha-numeric string 412 that uniquely identifies the line object. The second leg of the circuit line object 402B may include alpha-numeric strings 414 that uniquely identify that object. Because the alpha-numeric string 412 matches the alpha-numeric string 414, the processor 204 may determine that the first leg of the circuit line object 402A is the same line as the second leg of the circuit line object 402B. In another aspect, the geometry associated with a circuit start point 408 may be a circuit start point based on a number of factors determined by the processor 204, such as, for example, objects being connected to the circuit start point 408.

In other aspects, the input schematics file 400 may include a symbol legend 416 that includes one or more symbols e.g., the symbol 418) and a corresponding label (e.g., the label 420) for each respective one of the symbols. The processor 204 may parse the alpha-numeric strings that comprise the symbol legend 416 to form associations between a symbol used in the schematics input file 118 and its respective meaning. For example, the processor 204 may determine that a line is disconnected to the circuit group based on a symbol 422, or determine that a line object is connected based on another symbol 424.

Figure 4:
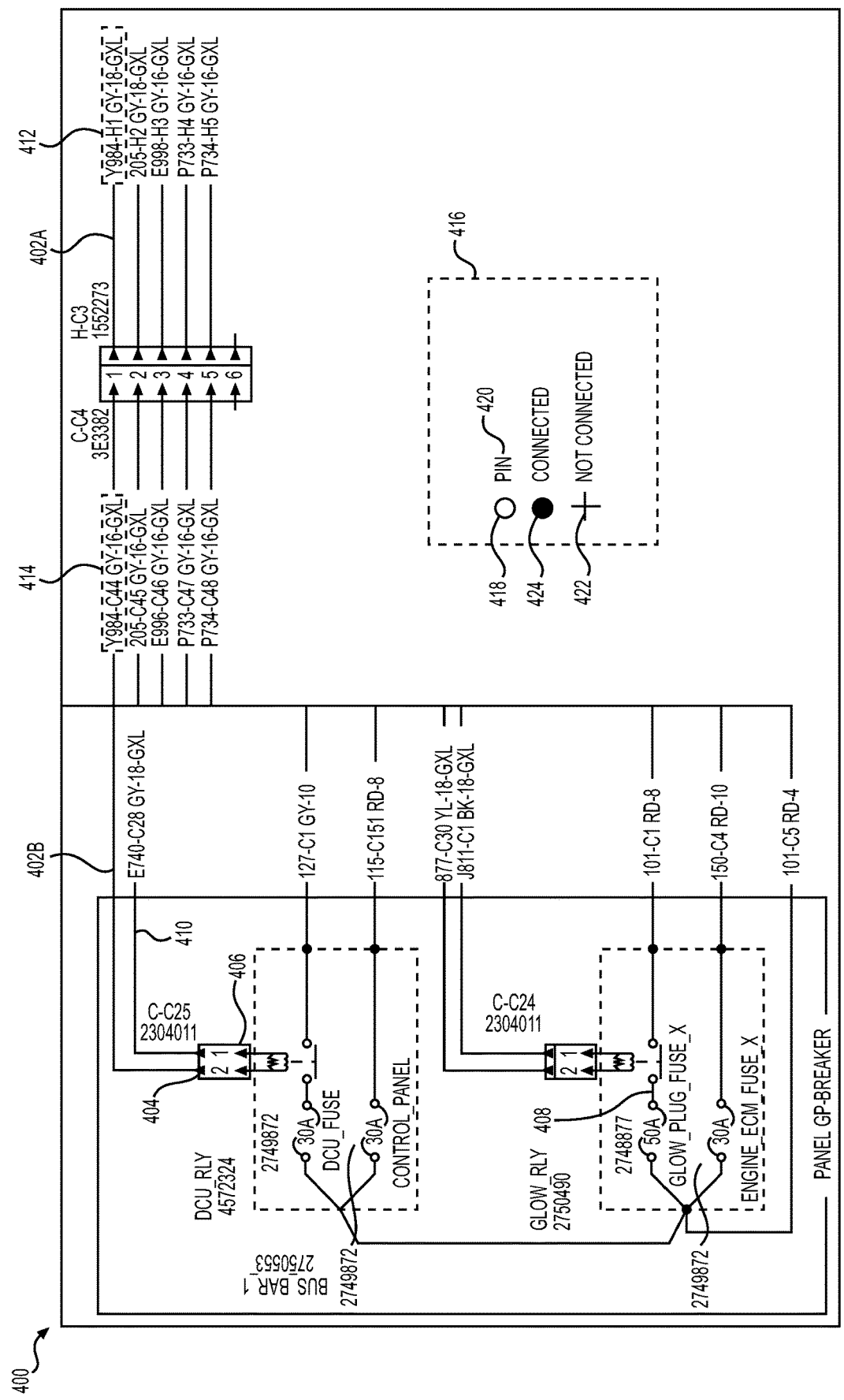
FIG. 4 is a schematic illustration of an example step for generating an electronics schematic according to an example embodiment of the present disclosure.
Figure 5:
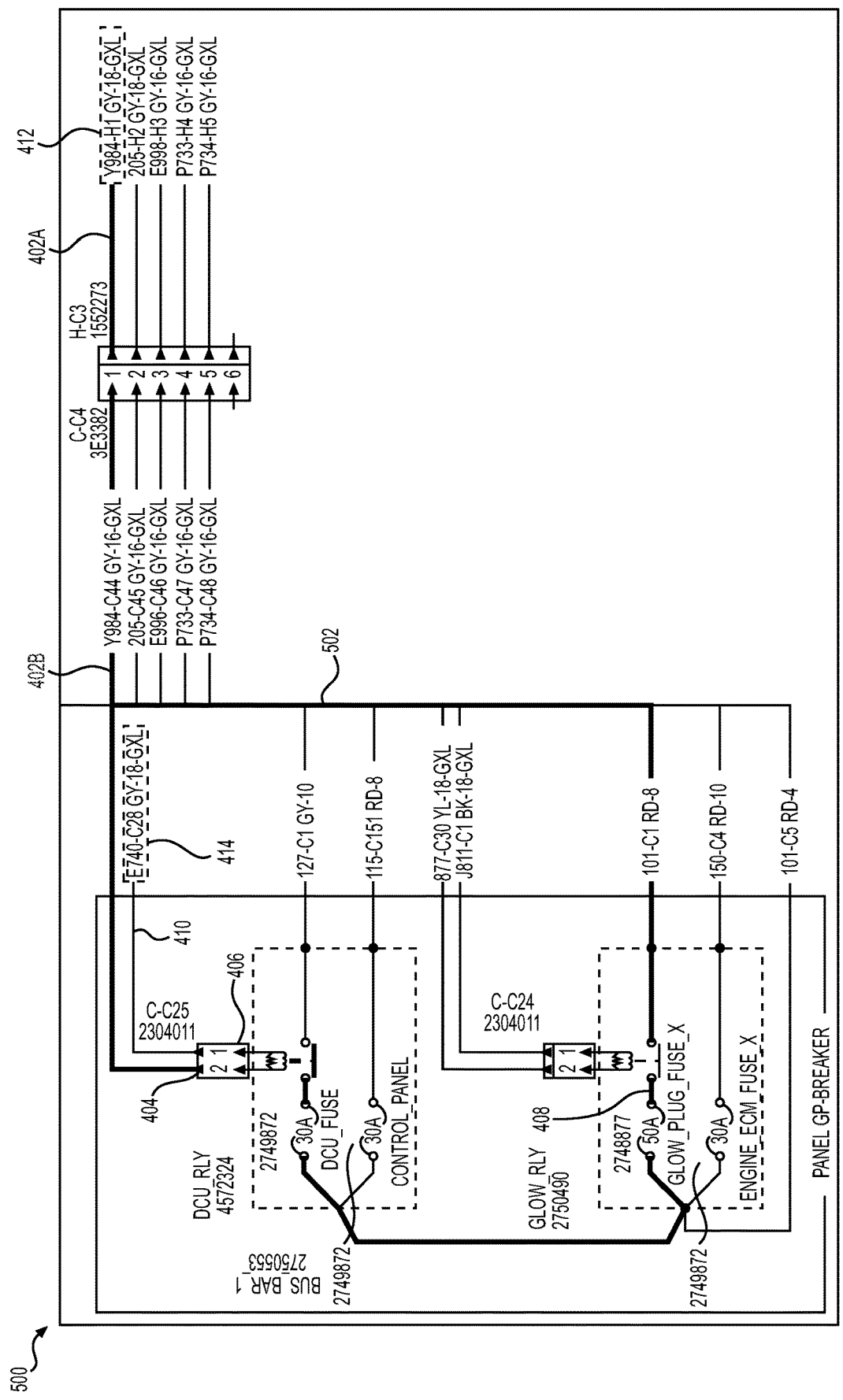
FIG. 5 is a schematic illustration of another example step for generating an electronics schematic according to an example embodiment of the present disclosure.

FIG. 5 is a schematic illustration of another example step for generating an electronics schematic according to an example embodiment of the present disclosure. FIGS. 4 and 5 are considered in conjunction with one another. After parsing the schematic input file 118, the processor 204 may group the plurality of line objects (e.g., 402A, 402B, etc.), a circuit start point 408, and a circuit end point 410, of the schematics input file 500 into predetermined categories that include horizontal lines, vertical lines, diagonal lines, and connector pins, among other groups. As depicted in FIG. 4, the processor 204 may determine whether a first line object (e.g., the first leg of the circuit line object 402A and the second leg of the circuit line object 402B) are associated with the pin object 404. In some aspects, the processor (and more precisely, the object recognition engine 112 executed by the processor 204) may have determined in a previous step that the first leg of the circuit line object 402A and the second leg of the circuit line object 402B are associated, and thus, are part of the same circuit line group 502 (shown as a thick line in FIG. 5).

Accordingly, the processor 204 may write metadata indicative of the association of the circuit line object 402A, 402B, with the pin object 404. Having an association between the circuit line object 402A, 402B and the pin object 404, the processor 204 may trace the line using one or more of the alpha-numeric strings associated with the line(s) (e.g., the alpha-numeric strings 412, 414). Accordingly, the processor 204 may determine a circuit start point 408 associated with the pin object 404. The processor 204 may also determine a circuit end point 410 associated with the circuit line object 402A, 402B. The processor 204 may generate metadata indicative of the circuit objects associated with the circuit line object 402A, 402B, and the pin object 404, and save the metadata in an associated data structure. The associated data structure may identify the circuit start point 408, the circuit end point 410, the pin object 404, and any intervening objects that may be connected to the circuit line object 402A, 402B, and part of the circuit group.

The processor 204 may then group the circuit line object (e.g., 402A, 402B, etc. with the pin object 404), the circuit start point 408, and the circuit end point 410, to form the circuit line group 502. The circuit line group 502 includes all associated objects that are determined by the processor 204 to be part of a connected circuit line. A circuit line group (e.g., the circuit line group 502) is made by generating metadata, and embedding that metadata in the output file 120 that identifies and associates the objects of the circuit line group 502.

Figure 6:
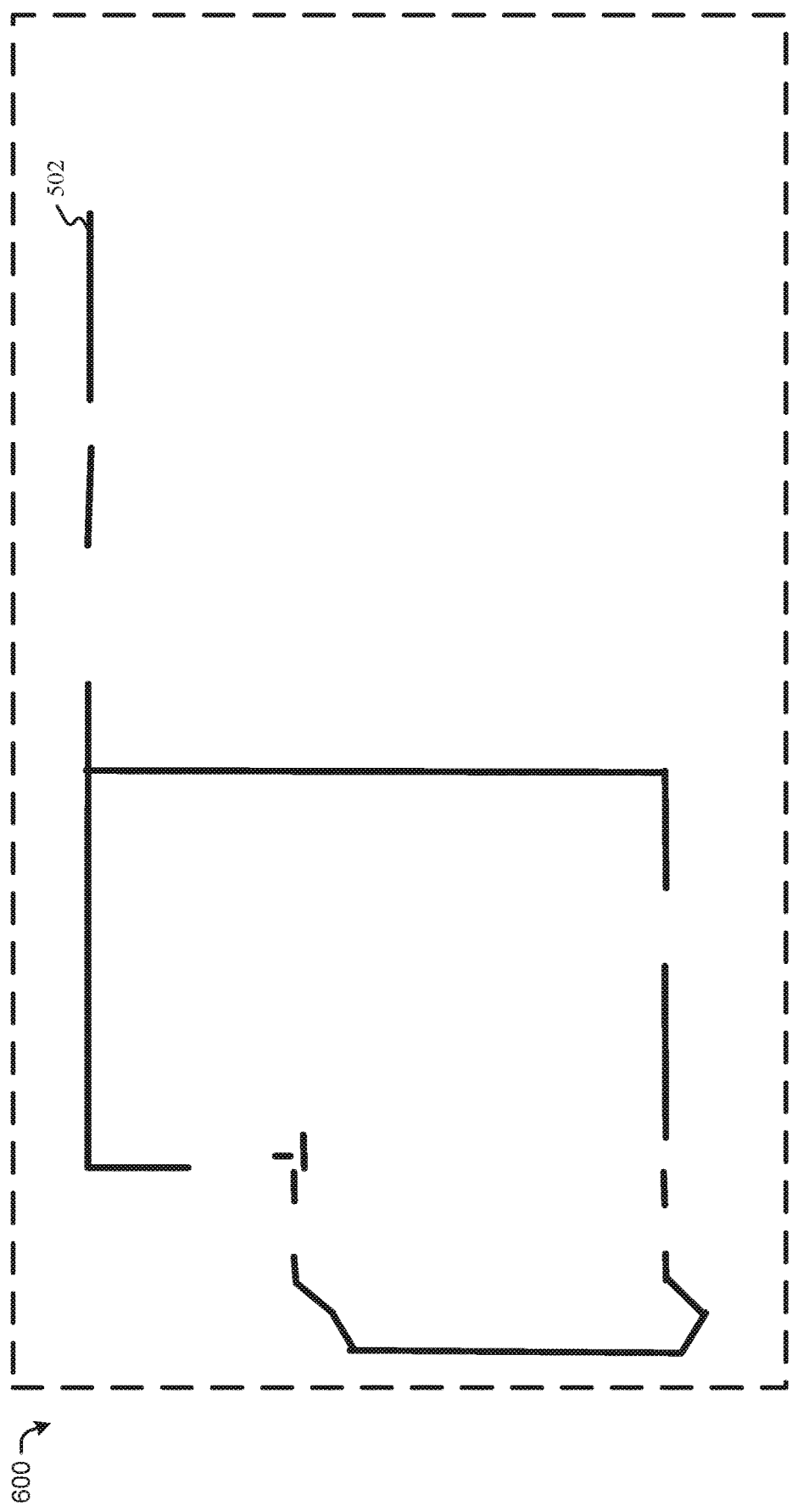
FIG. 6 is a schematic illustration of another example step for generating an electronics schematic according to an example embodiment of the present disclosure.

FIG. 6 is a schematic illustration of another example step for generating an electronics schematic, according to an example embodiment of the present disclosure. FIG. 6 depicts the circuit line group 502 as an isolated group, with all other objects temporarily removed from view. The processor 204 may write metadata identifying all of the circuit objects comprising the circuit line group 502 to the memory 202 as part of the schematics output file 120.

FIG. 7 is yet another schematic illustration of an example step for generating an electronics schematic according to an example embodiment of the present disclosure. After grouping the objects depicted in FIG. 6 into the circuit line group 502, the processor 204 may group all remaining objects of the input schematics file 400 (that are not the circuit line group 502) into a second group 702. By isolating the circuit line group 502 and isolating the second group 702, the processor 204 may define output characteristics for each respective group such that the circuit line group 502, when selected by the user 108, is output having a brighter luminance than the second group 702. Stated another way, the processor 204 may generate instructions that cause the circuit line group 502, when user-selected, to be output on the user electronic device 106 as a highlighted (lit up) circuit line, whereas the background circuit objects (everything else) may be dimly lit (with less luminance than the circuit line group), and gray in color. Other combinations of colors and luminance are contemplated.

As earlier explained, the processor 204 may determine whether the circuit start point is associated with the first pin object in different ways. Namely, the processor may determine whether objects are associated with one another based on alpha-numeric string data (e.g., the object labels in the schematic). In another aspect, the processor 204 may determine associations between objects based on geometry of the lines that comprise the objects. FIG. 8 is a schematic illustration of another example step for generating an electronics schematic according to an example embodiment of the present disclosure. FIG. 8 depicts the circuit portion 800 of a SVG file, such as, for example, the input schematics file 400. In the circuit portion 800, the objects may or may not be associated with one another, and there may be insufficient alpha-numeric string data from which a decision can be made based on object labels. In the example of FIG. 8, the processor 204 may evaluate characteristics of the object geometry in the SVG file to make determinations of relationships between line objects. For example, the circuit portion 800 includes a line object 802, a line object 804, a circuit block object 806, the line object 808 (also the circuit start point 809 in this example), a connecting line object (the line object 810), and at least one pin object (e.g., the pin object 812). A non-connected line object 814 is present, however the processor 204 may not yet have determined the association of the non-connected line object 814 with the other objects.

Figure 9:
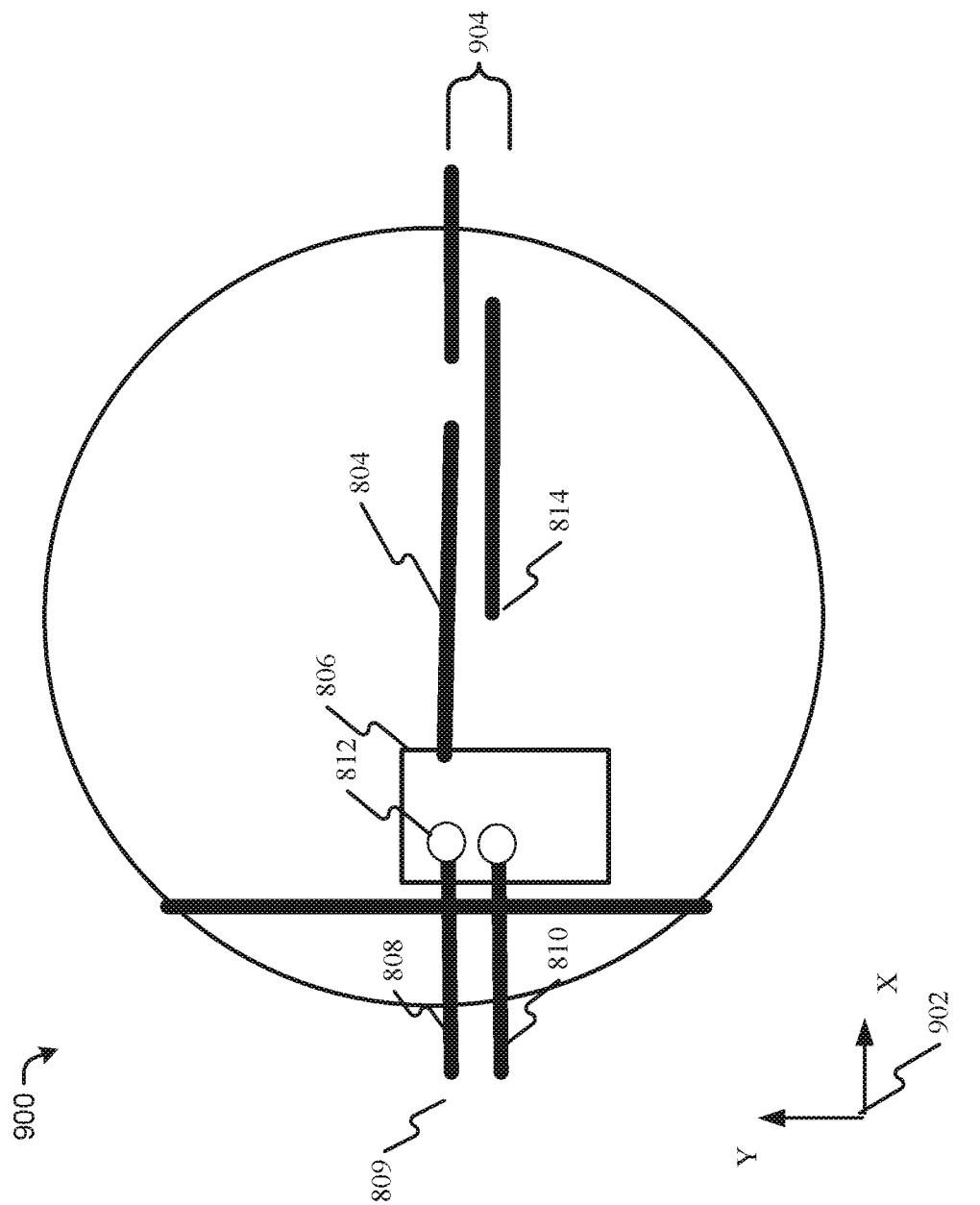
FIG. 9 is an expanded view of the schematic illustration of FIG. 8 according to an example embodiment of the present disclosure.

FIG. 9 depicts an expanded view of the schematic illustration of FIG. 8, according to an example embodiment of the present disclosure. Referring now to FIG. 9, the processor 204 may determine whether the circuit start point 809 associated with the pin object 812 based on a coordinate location of the circuit start point and a coordinate location of the first pin object. A coordinate location is defined, as appreciated by those skilled in the art, by a relative coordinate location in the X and Y planes (shown as the X-Y plane 902). The coordinate location is respective to an arbitrary origin point 0,0, which corresponds to a point in space at 0 in the X plane and 0 in the Y plane. As shown in FIG. 9, the pin object 812 shares the same Y value as the line object 804. Accordingly, the processor 204 may determine that there is a relationship between the pin object 812 and the line object 808 based on the objects sharing the same Y coordinate (that is, the center of the circle forming the pin object 812 shares the same Y coordinate within a margin of error as the line object 808), and further based on a proximity of the objects to one another (that is, the distance between the pin object 812 and the line object 808 are within a predetermined threshold of distance from one another in the X plane such that they touch at some point).

Based at least in part on determining that the coordinate location of the circuit start point 809 and the coordinate location of the pin object 812 are coterminous within a predetermined threshold (indicating that they are touching), the processor 204 may write metadata to the schematics output file 120 file indicative of a pin-start association between the pin object 812 and the circuit start point 809. In this example, alpha-numeric data was not used to determine the association between the pin and the circuit start.

INDUSTRIAL APPLICABILITY

The present disclosure provides systems and methods for generating an schematics output file 120 with single wire tracing, which can be executed on a user electronic device 106 to provide a single wire trace by a single selection by the user 108. Such systems and methods may be used to automate generation of one or more electronics schematics file(s) using an electronic SVG file 118 as an input. An example method 300 can include parsing the schematics input file 118 (which may be a SVG file), and sorting a plurality objects, which may include line objects in the file, into predetermined categories including horizontal lines, vertical lines, diagonal lines, and connector pins. The method includes determine associations between the line objects. For example, according to the method 300 described herein, the processor 204 may determine whether a first line object is associated with a pin object, and may write metadata indicative of the association. The method may include determining start points and end points of the object, and grouping the objects into a cohesive circuit line group that may be selected by the user 108 via a user electronic device 106. When selected, the circuit line group 502 can be output with a different color than the object that are not in the circuit line group 502. By generating output with a different color, the circuit line group 502 is highlighted without complicated tracing steps by the technician (e.g., the user 108), which can save time and increase technical accuracy in use.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A computer-implemented method, comprising:
    sorting, via a processor, a plurality of objects in an electronics schematic file into predetermined categories;
    determining, via the processor, a first association between a first line object of the plurality objects, and a first pin object of the plurality of objects, wherein the first association indicates that the first line object and the first pin object are part of a single line;
    determining, via the processor, a second association between a circuit start point of the plurality of objects and the first pin object, wherein the second association indicates that the circuit start point and the first pin object are part of the single line;
    determining, via the processor, a circuit end point of the plurality of objects, wherein the circuit end point is part of the single line;
    forming a first circuit line group including the first line object, the first pin object, the circuit start point, and the circuit end point;
    forming a second circuit line group including at least one second line object, and a second pin object, wherein the second circuit line group is exclusive of the first circuit line group;
    generating, via the processor, an electronics schematic output file that maintains the first association and the second association, wherein the electronics schematics output file is configured such that, when executed by the processor, the first circuit line group is presented with user-selectable single line tracing; and
    identifying the circuit start point via the processor, wherein identifying the circuit start point comprises:
        determining a coordinate location of the first pin object with respect to a coordinate location of an origin point in the electronics schematics file;
        determining a coordinate location of the circuit start point with respect to the coordinate location of the origin point; and
        determining that the circuit start point associated is associated with the first pin object based on the coordinate location of the circuit start point and the coordinate location of the first pin object.

2. The method of claim 1, wherein the electronics schematic output file comprises executable instructions for:
    presenting the first circuit line group and the second circuit line group on a display device;
    receiving an input indicating a selection of the first circuit line group; and
    presenting, based at least in part on the input, the first circuit line group on the display device in a first color; and
    presenting, based at least in part on the input, the second circuit line group in a second color.

3. The computer-implemented method of claim 1, wherein determining the first association comprises parsing at least one alpha-numeric string in the electronics schematic input file to identify at least one character associated with one or more of the first line object and the first pin object, the method further including:
   identifying at the least one character of the at least one alpha-numeric string; and
   determining that the at least one character is associated with the circuit start point based on i) the at least one character being associated with the circuit start point and ii) the at least one character being associated with the first pin object.

4. The computer-implemented method of claim 3, further comprising determining the first line object and another object of the plurality of objects are part of the single line is based at least in part on i) at least one character associated with the first line object and ii) at least one character associated with another line object of the plurality objects.

5. The computer-implemented method of claim 1, further comprising, embedding metadata in the electronics schematic output file, the metadata indicative of a pin-start location associated with the first pin object.

6. The computer-implemented method of claim 5, wherein embedding the metadata in the electronics schematic output file is based at least in part on determining that the circuit start point and the first pin object are coterminous within a predetermined threshold.

7. The computer-implemented method of claim 1, wherein the electronics schematic output file is a scalable vector graphics file.

8. The computer-implemented method of claim 1, wherein the electronics schematic output file is generated without user input.

9. The computer-implemented method of claim 1, further comprising:
   determining an object type based on a graphic geometry of an object of the plurality of objects; and
   sorting the plurality of objects in the electronics schematics file into the predetermined categories based on the graphic geometry for each of the plurality of objects.

10. The computer-implemented method of claim 1, wherein the predetermined categories comprise horizontal lines, vertical lines, diagonal lines, and connector pins.

11. An electronics schematic generation system comprising:
   a memory;
   a display; and
   a processor connected with the memory and the display, the processor operable for:
   determining, via the processor, a first association between a first line object of a plurality objects in an electronics schematic file, and a first pin object of the plurality of objects, wherein the first association indicates that the first line object and the first pin object are part of a single line;
   determining, via the processor, a second association between a circuit start point of the plurality of objects and the first pin object, wherein the second association indicates that the circuit start point and the first pin object are part of the single line;
   determining, via the processor, a circuit end point of the plurality of objects, wherein the circuit end point is part of the single line;
   forming a first circuit line group including the first line object, the first pin object, the circuit start point, and the circuit end point;
   forming a second circuit line group including at least one second line object, and a second pin object, wherein the second circuit line group is exclusive of the first circuit line group;
   generating, via the processor, an electronics schematic output file that maintains the first association and the second association, wherein the electronics schematics output file is configured such that, when executed by the processor, the first circuit line group is presented with user-selectable single line tracing; and
   identifying the circuit start point via the processor, wherein identifying the circuit start point comprises:
      determining a coordinate location of the first pin object with respect to a coordinate location of an origin point in the electronics schematic file;
      determining a coordinate location of the circuit start point with respect to the coordinate location of the origin point; and
      determining that the circuit start point associated is associated with the first pin object based on the coordinate location of the circuit start point and the coordinate location of the first pin object.

12. The system of claim 11, wherein the electronics schematic output file for the electronics schematic comprises executable instructions for:
   presenting the first circuit line group and the second circuit line group on a display device;
   receiving an input indicating a selection of the first circuit line group; and
   presenting, based at least in part on the input, the first circuit line group on the display device in a first color; and
   presenting, based at least in part on the input, the second circuit line group in a second color.

13. The system of claim 11, wherein determining the first association comprises parsing at least one alpha-numeric string in the electronics schematic input file to identify at least one character associated with one or more of the first line object and the first pin object, the further including:
   identifying at the least one character of the at least one alpha-numeric string; and
   determining that the at least one character is associated with the circuit start point based on i) the at least one character being associated with the circuit start point and ii) the at least one character being associated with the first pin object.

14. The system of claim 13, further comprising determining the first line object and another object of the plurality of objects are part of the single line is based at least in part on i) at least one character associated with the first line object and ii) at least one character associated with another line object of the plurality objects.

15. The system of claim 11, further comprising, embedding metadata in the electronics schematic output file, the metadata indicative of a pin-start location associated with the first pin object.

16. The system of claim 15, wherein embedding the metadata in the electronics schematic output file is based at least in part on determining that the circuit start point and the first pin object are coterminous within a predetermined threshold.

17. The system of claim 11, further comprising:
   determining an object type based on a graphic geometry of an object of the plurality of objects; and sorting the plurality of objects in the electronics schematic file into predetermined categories based on the graphic geometry for each of the plurality of objects.

* * * * *